(12) United States Patent
Hack

(10) Patent No.: US 11,062,205 B2
(45) Date of Patent: Jul. 13, 2021

(54) HYBRID NEUROMORPHIC COMPUTING DISPLAY

(71) Applicant: Universal Display Corporation, Ewing, NJ (US)

(72) Inventor: Michael Hack, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 268 days.

(21) Appl. No.: 16/376,744

(22) Filed: Apr. 5, 2019

(65) Prior Publication Data

US 2019/0311256 A1     Oct. 10, 2019

Related U.S. Application Data

(60) Provisional application No. 62/653,797, filed on Apr. 6, 2018.

(51) Int. Cl.
| | |
|---|---|
| *G06N 3/06* | (2006.01) |
| *G06N 3/067* | (2006.01) |
| *H01L 31/12* | (2006.01) |
| *G06N 3/04* | (2006.01) |
| *H01L 27/32* | (2006.01) |
| *H01L 27/144* | (2006.01) |

(52) U.S. Cl.
CPC ............ *G06N 3/0675* (2013.01); *G06N 3/04* (2013.01); *H01L 27/1446* (2013.01); *H01L 27/3227* (2013.01); *H01L 31/12* (2013.01)

(58) Field of Classification Search
None
See application file for complete search history.

(56) References Cited

U.S. PATENT DOCUMENTS

| | | | |
|---|---|---|---|
| 4,769,292 A | | 9/1988 | Tang |
| 5,247,190 A | | 9/1993 | Friend |
| 5,393,994 A | * | 2/1995 | Kobayashi .......... G06N 3/0675 |
| | | | 257/84 |
| 5,703,436 A | | 12/1997 | Forrest |
| 5,707,745 A | | 1/1998 | Forrest |
| 5,834,893 A | | 11/1998 | Bulovic |
| 5,844,363 A | | 12/1998 | Gu |
| 6,013,982 A | | 1/2000 | Thompson |
| 6,087,196 A | | 7/2000 | Sturm |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Benjamin P Sandvik
(74) *Attorney, Agent, or Firm* — Butzel Long

(57) ABSTRACT

A hybrid neuromorphic computing device is provided, in which artificial neurons include light-emitting devices that provide weighted sums of inputs as light output. The output is detected by a photodetector and converted to an electrical output. Each neuron may receive output from one or more other neurons as initial input, allowing for high degrees of fan-out and fan-in, including true broadcast-to-all functionality.

23 Claims, 5 Drawing Sheets

(56) References Cited

U.S. PATENT DOCUMENTS

| | | | |
|---|---|---|---|
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2016/0196489 | A1* | 7/2016 | Guillanneuf .......... G06N 3/067 706/27 |
| 2017/0229663 | A1 | 8/2017 | Tsai |
| 2018/0039882 | A1* | 2/2018 | Ikeda .................. G06N 3/0635 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Shastri, et al., "Principles of Neuromorphic Photonics," Department of Electrical Engineering, Princeton University, Princeton, NJ 08544, USA, Emerging Technologies, Optics, Dec. 29, 2017, 28 pages.

\* cited by examiner

HYBRID NEUROMORPHIC COMPUTING DISPLAY

CROSS-REFERENCE TO RELATED APPLICATIONS

This application is a non-provisional of, and claims the priority benefit of U.S. Provisional Patent Application Ser. No. 62/653,797, filed Apr. 6, 2018, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a neuromorphic optical processing device is provided, which includes a plurality of electrically-connected artificial neurons, each of which includes one or more light-generating components such as OLEDs, microLEDs, or the like, and one or more photodetectors which sum outputs of the one or more light generating components to an electrical output of the photodetector. Each output of each light-generating components is determined by one or more electrical inputs to the each light-generating component. The photodetector output of each neuron may be provided as one of the one or more electrical inputs of at least one other neuron of the first plurality of neurons. Each photodetector may include a thin film photodetector, which may be disposed within the device such that light emitted by the light-generating component is incident on the thin film photodetector.

Weighting factors, which may include excitatory and/or inhibitory weighting factors, may be applied to the inputs of the one or more light-generating components. The weighting factors may be stored in a device integral with the neurons or external to the neurons.

The photodetector output may be provided to a threshold device that provides an output based upon the output of the photodetector, and the output of the threshold device may be provided as an input to one or more of the plurality of neurons. The threshold device may be configured to output a signal that is greater than zero only if the sum of the outputs of photodetectors providing outputs to the threshold device exceeds a threshold value. For example, if the sum of the outputs of the photodetectors exceeds a threshold value, the output of the threshold device may be in the form of a spike. Similarly, the input signals to the neurons may be in the form of a spike.

The processing may be a display panel such as an AMOLED panel and/or an imaging device as well as a general processing device, and may operate in each mode concurrently or sequentially. For example, the neurons may make up one row of display elements of the display panel. As another example, a data line of the display panel provides the input to one or more inputs to the plurality of neurons. As a specific example, the display panel may include at least 1,000 rows of display pixels, each row of the at least 1,000 rows comprising at least 1,000 pixels, and each neuron may include all pixels within a single row. As another example, the device may include multiple pixels and each neuron may include one or more of the pixels. The pixels may operate alternately as processing components, imaging components, or display components, or a fraction of pixels may be reserved for each use.

Each artificial neuron may be electrically connected to each other neuron, such that an output of each threshold device from each neuron is available as an input to one or more other neurons in the device.

According to an embodiment, a method of operating an artificial neuron array is provided that includes selecting a first row of the plurality of rows of neurons, receiving weighting factor pairs for each neuron in the first row, outputting, by each artificial neuron in the first row, a sum of weighted input values, the weighted input values being represented by light emitted by a light-emitting device of the each artificial neuron based upon the weighting factor pairs for the each artificial neuron and one or more input values received by the each artificial neuron; detecting, by a photodiode in each neuron, the light emitted by the light-emitting device in the each neuron; and for each neuron, based upon the detected light emitted by the light-emitting device in the each neuron and a threshold value, outputting a value of 0 or 1.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
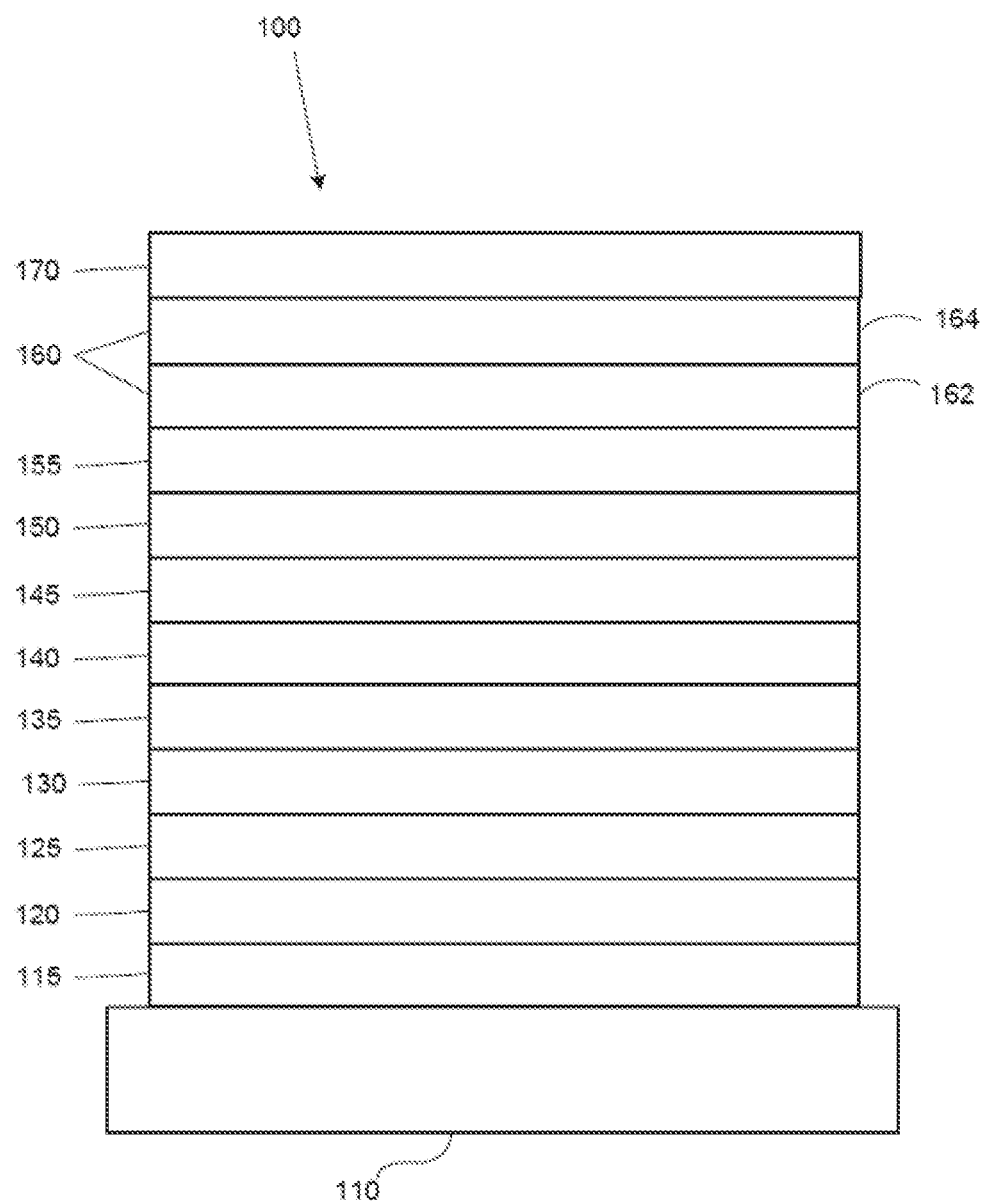
FIG. 1 shows an organic light emitting device suitable for use in embodiments of the present invention, for example as a component of a neuron as disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
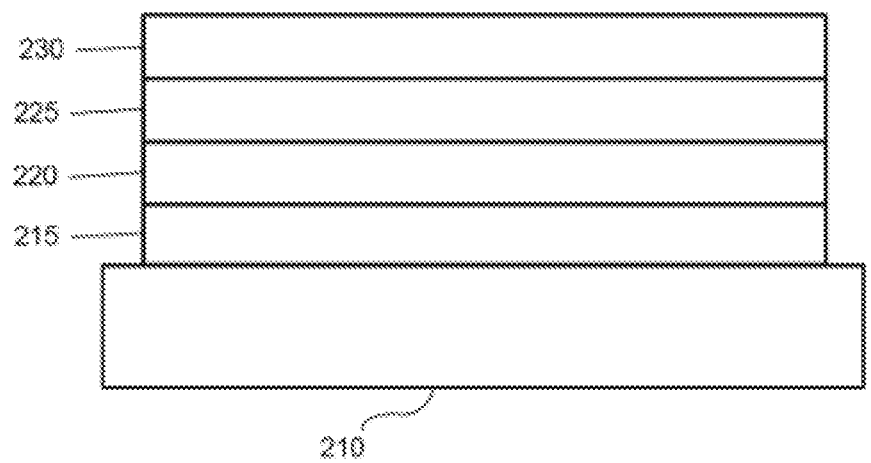
FIG. 2 shows an inverted organic light emitting device that does not have a separate electron transport layer suitable for use in embodiments disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C. to 30 C., and more preferably at room temperature (20-25 C.), but could be used outside this temperature range, for example, from −40 C. to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.
Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.
HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.
ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.
Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Some computing needs such as processing large amounts of data during complex image processing or deep learning applications, may be more suitable for implementation on computing devices that implement neuromorphic principles rather than conventional Von Neumann architecture. Hybrid computing, which uses both analog and digital processes and may combine photonic and electronic processing, may provide enhanced performance over conventional approaches.

Current work in neuromorphic photonic computing such as described, for example, in "Principles of Neuromorphic Photonics," arXiv:1801.00016v1 (Jan. 3, 2018) suggests neuromorphic photonic computing architectures may be based on large scale coupling of optoelectronic neurons. Embodiments disclosed herein provide alternative and additional approaches to neuromorphic computing in which the basic architecture of a display such as a multiplexed flat-panel OLED display or similar device, in which conventional display pixels may be replaced or augmented by electro-optical neurons that include light-emitting devices such as OLEDs, photodetectors such as thin film photodiodes, and control circuitry such as thin film transistors. In contrast to conventional or other current optical neuromorphic computers, in embodiments disclosed herein the light used to perform computations within each neuron is generated within the neurons themselves, as opposed to being generated by lasers or other light sources that are external to the neurons.

Neuromorphic computers work fundamentally differently from conventional Von Neumann computing devices. For example, there are no hard-wired logic connections between output and input stages of logic gates. Instead, neuromorphic computers are designed to mimic the human brain in which a series of processing elements (neurons), respond to a large number of inputs from neighboring neurons, and if the weighted sum of these input signals exceeds a threshold value, then the neuron produces an output. Such an approach may provide noise immunity for highly scalable systems. The weighting factors are tunable, and learning is achieved through tuning of these weighting factors. Using parallel analog weighting circuits and optical analog summation, high-speed system operation may be achieved.

In embodiments disclosed herein, input weighting may be achieved by adjusting the analog output voltage of conventional display data drivers, and learning by adjusting these weighting factors and storing their values in system memory. The weighted output of these data drivers may be used to control the current through, and hence the light output, of an OLED or similar light-emitting device in the neuron. By using the basic framework of a display, such as an OLED display panel, to implement a neuromorphic computer, highly parallel processing available through multiplexing and the highly interconnected nature of the row and column lines (matrix) of a flat panel display may be used to improve processing efficiency, scale, and availability. For example, OLED technology may be used to generate light to implement optical processing in each neuron. Other forms of light-emitting elements such as microLEDs may be used.

In embodiments disclosed herein, emissive components such as OLEDs may be used to provide not only illumination such as for an addressable display or for general purpose illumination, but also for processing. For example, artificial neural networks have recently gained attention as an attractive option for modeling and reproducing the natural processing abilities of a human brain. Such networks typically include a multitude of artificial neurons, each of which may be embodied in one or more nonlinear nodes, which are connected via a network such that information may be transmitted from one neuron to another. In some embodiments disclosed herein, each artificial neuron may receive input from one or more other neurons and may be configured only to activate (or "fire") if the sum of inputs to the neuron exceed a threshold value. As used herein, a "neuron" refers to an artificial neuron, i.e., one that is embodied and implemented in a non-biological device such as a computing and/or display device.

A computing device as disclosed herein may be fabricated on plastic or other suitable rigid or flexible substrate, and may result in extremely high fan-in and fan-out capabilities as disclosed herein. Further, such devices may use existing architectures and/or components and highly manufacturable thin film processes. Since a device as disclosed herein contains photodetectors, the same array may be used as an imaging device and/or artificial intelligence processor to interpret and learn from images being recorded.

Computing devices as disclosed herein also may fabricated on silicon wafers to provide high density and functionality, similar to an OLED microdisplay, with an option of placing the photodetectors on the device lid.

Figure 3:
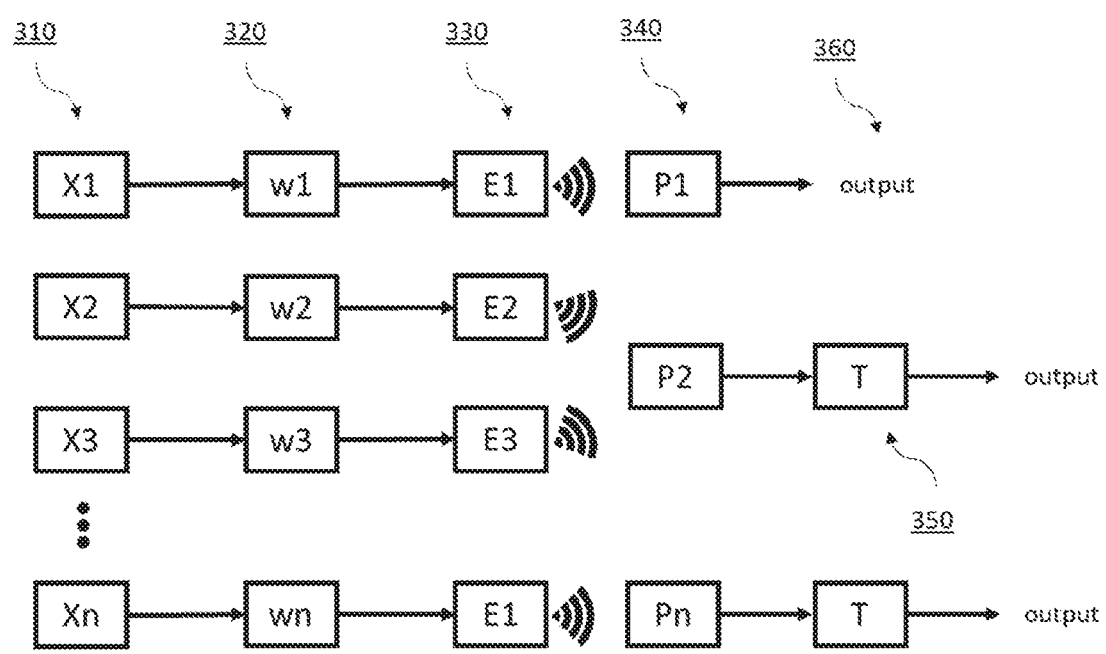
FIG. 3 shows schematic examples of artificial neurons according to embodiments disclosed herein.

An example representation of a neural network according to the present disclosure is shown in FIG. 3. As described in further detail herein, in such an embodiment a plurality of inputs are used by a plurality of artificial neurons to generate output values using one or more light-emitting devices ("emissive devices" or "emitters"), such as OLEDs, and photodetectors such as thin film photodetectors, where the output of the emissive devices is determined at least in part by the initial input(s) to each neuron, and the output of the neuron is determined at least in part by the output of one or more of the emissive devices.

The example neural network shows multiple neurons. Each neuron includes one or more input signals or circuits 310. Each provides an input to an emissive device 330 that emits light based at least partially upon the input signal. The input may be a "spike," i.e., a sudden rise and fall in an electrical signal, such as may be used to represent a binary "1" or similar data for s short period of time. One or more photodetectors 340 receives the emitted light and generates an output signal 360 based at least in part on the presence and/or intensity of the emitted light. Similarly, an output of a threshold device as disclosed herein also may be in the form of a spike or other electrical representation of a logical/binary 1 or 0, or other similar signal.

Each input may have a weighting factor 320 applied to it. For example, referring to the first example neuron shown, the input X1 may have a weighting factor w1 applied by a weighting circuit or other component that modifies the input before or as it is received by the neuron. The weighted input then may be provided to the emitter E1, based upon which it emits light that is detected by a photodetector P1. Each light-emitting device in a neuron as disclosed herein may be, for example, an OLED, a micro-LED, an LED, a quantum dot device, or any other suitable light-emitting device. In some cases, it may be desirable for the light-emitting devices to be fabricable using the same techniques used to fabricate other components of the neurons, such as photodetectors, TFT structures, and the like.

A neuron as disclosed herein may include multiple inputs and/or light-emitting devices. For example, the neuron 302 includes two inputs X2, X3 to the emitters E2, E3, one or both of which may have the same or separate weighting factors w2, w3 applied. The photodetector P2 may detect light emitted by one or both of the emitters, depending upon whether each input causes each device to emit light. Similarly, a neuron may include one or more photodetectors, regardless of how many light-emitting devices are present in the neuron. For example, the neuron 301 may include one or more photodetectors in addition to the photodetector P1 shown, each of which may detect light from the light-emitting device E1.

A neuron as disclosed herein may include a threshold device 350 that provides an output signal depending upon whether the output of the photodetector(s) in the neuron are at or above a threshold. For example, if the output of the photodetector P2 in the example neuron 302 is above a set threshold, the threshold device 350 may output a binary signal "1", or "0" if the photodetector output is below the threshold.

As described in further detail herein, each neuron may receive output from one or more other neurons as its input. For example, the neuron 301 may provide an output as previously disclosed, which is then transmitted to one or more other neurons 302, 309 as one or more inputs X2, X3, Xn. Similarly, the output of the neuron 302 may be provided to one or more other neurons 301, 309 as an input X1, Xn, and so on.

Flat panel display and similar architecture may be particularly suitable for implementation of neuromorphic computing devices as disclosed herein. Conventional flat panel displays include a large number of pixels, which are highly interconnected through data and gate lines and multiplexed in parallel through the system architecture. For example, in an OLED display, pixel luminance information is usually delivered by analog voltages sent down the data lines to a multi-TFT pixel driving circuit which in turn produces a drive current that produces an analog photon output from each OLED.

Similarly, in embodiments disclosed herein, each neuron as previously described may be represented by, and implemented as, one or more "pixels" that are driven by many data lines, with each data line representing one input to the neuron. For example, referring to FIG. 3, the light-emitting devices E 330 in each neuron may be provided by one or more emissive structures that would correspond to individual pixels in a conventional display panel. As described in further detail herein, a neuron may include one to many pixels, including an entire row of pixels in the display panel architecture.

In embodiments disclosed herein, the weighting factors may be stored in a look-up table and each input may have a positive or negative weighting factor. For example, referring to the example neuron structures shown in FIG. 3, each weighting factor w may obtain weighting factors from a storage medium in or external to the neuron and/or the display. Each weighting factor w 320 also may include be implemented as a pair of positive and negative weighting factors. All the weighted inputs to each neuron produce a series of currents. This may be achieved, for example, through a conventional sub-pixel addressing circuit. The weighted inputs may be summed as they enter the light-emitting device or series of light emitting devices, so the light emitted by the device or devices is proportional to the sum of the weighted inputs. The light output from this device or these devices can then be converted back into an electrical signal by one or more photodetectors optically coupled to these light emitting devices. For example, referring again to FIG. 3, each emitter 330 may emit light in proportion to the weighted input or inputs received by the emitter. As another example, in a conventional OLED panel architecture, each data line may be coupled to an individual OLED and photodetector, and the output from all the photodetectors may be collected in a bus line to which the photodetector(s) 340 or the threshold device(s) provide an output signal. The weighting factors may be stored within the processing device, within each neuron, or external to the neurons and/or the device. For example, if the optical neuromorphic computer is built on a silicon wafer using an architecture similar to a microOLED display, then weighting factors for each neuron may be stored using conventional silicon memory elements built into the silicon wafer in each neuron. More generally, any suitable computer-readable medium or logic circuit may be used to store and provide the weighting factors, which may be integral with or external to the neurons or the processing device.

As previously described, one or more photodetectors may convert light output provided by the emitter(s) in each neuron into an output signal, which also may be processed by a threshold device that only provides a positive output signal if the output from the photodetector(s) is at or above a threshold. For example, an output signal from one or more photodetectors may be provided as a current that is converted to a voltage using a capacitor connected to the input gate of a threshold TFT in an inverter circuit. The TFT then provides an output if the input voltage exceeds a threshold voltage of the TFT.

A display panel-based architecture as disclosed herein may itself to large-scale parallel processing and the ability to have each neuron fan-out and fan-in to very high numbers of connected neurons. For example, a display having one million conventional "pixels" may be reconfigured as 1,000 neurons of 1,000 pixels each, where each neuron is connected to every other neuron in the array, thereby allowing for full "broadcast to all" capability within the neuromorphic computing device. In contrast to purely electronic neuromorphic computing devices, this architecture allows for extremely high fan-in and fan-out capabilities. Similarly, compared to purely optical photonic computing devices, this architecture allows electronic components to be used to implement the weighting factors, and the array architecture may use conventional or modified thin film processes and devices that are known and understood in the art.

A neuron in a neuromorphic computing device typically is modeled as providing several features: weighting, fan-in, summation of weighted inputs, non-linear operation (thresholding), and cascadable output generation. According to embodiments disclosed herein, each of these features may be provided by a multiplexed flat panel display architecture. For example, each individual neuron may include a series of pairs of sub-pixel circuits, each of which is driven by its own data line and data driver. The data driver may be integral with the pixel array, or external to the array and connected through either a multiplexer or other high-density connection mechanism. As previously disclosed, each neuron input may be associated with a pair of electrical inputs, with one representing an excitatory (or positive) weighting input and the other an inhibitory (or negative) weighting input.

In an embodiment, weighting of one or more inputs may be implemented by storing one or more weighting factors in a lookup table or other computer-readable medium, with a weighting value for each sub-pixel. The weighting factors may be updated during processing tasks performed by the processing device as disclosed herein, for example during machine learning tasks that regularly or recursively update the weighting factors based upon prior processing steps or increments. The analog drive voltage from each data driver may therefore represent a specific current for an individual light-emitting device (such as in a conventional OLED display), which then represents the product of the output of the last neuron to be activated (1 or 0) multiplied by the weighting factor for the neuron input.

In a computing device as disclosed herein, fan-in may be accomplished by the data lines using the same multiplexing format as used in a conventional display panel, with a similar sub-pixel drive circuit. For example, as previously disclosed a 1,000×1,000 pixel display panel (1,000,000 pixels total), may provide 1,000 neurons, each neuron having 2 inputs or sub-pixels (one positive and one negative) for each of its 1,000 inputs, and each neuron occupying one scan line of the conventional display panel architecture. This structure provides a 1,000 neuron circuit with complete broadcast to all capability as previously disclosed, where every neuron is connected to every other neuron. Other interconnection schemes may be used, as described in further detail here. There may be a trade-off in the number of neurons that can be accommodated within a given emitter array versus the fan-in and fan-out capabilities of the array. For example, in an array with X rows and Y pairs of data lines, each neuron input contains 2 sub-pixel driving circuits to provide a negative and positive output to the respective excitatory and inhibitory photodetectors as previously disclosed. For a square arrangement (X=Y) where each row represents 1 neuron, the array contains X neurons that each broadcast an output to every other neuron and each neuron will have a weighted input from every other neuron to provide true and complete broadcast to all capability as previously disclosed. However, as described in further detail herein, for configurations in which a reduced level of fan-in is acceptable, more neurons can be incorporated on to each scan line. Broadcast Loops (BLs), then may be implemented as disclosed in further detail herein, where each neuron on a scan line is incorporated into a BL, but there may be less than 1 BL for each neuron on a scan line.

Figure 4:
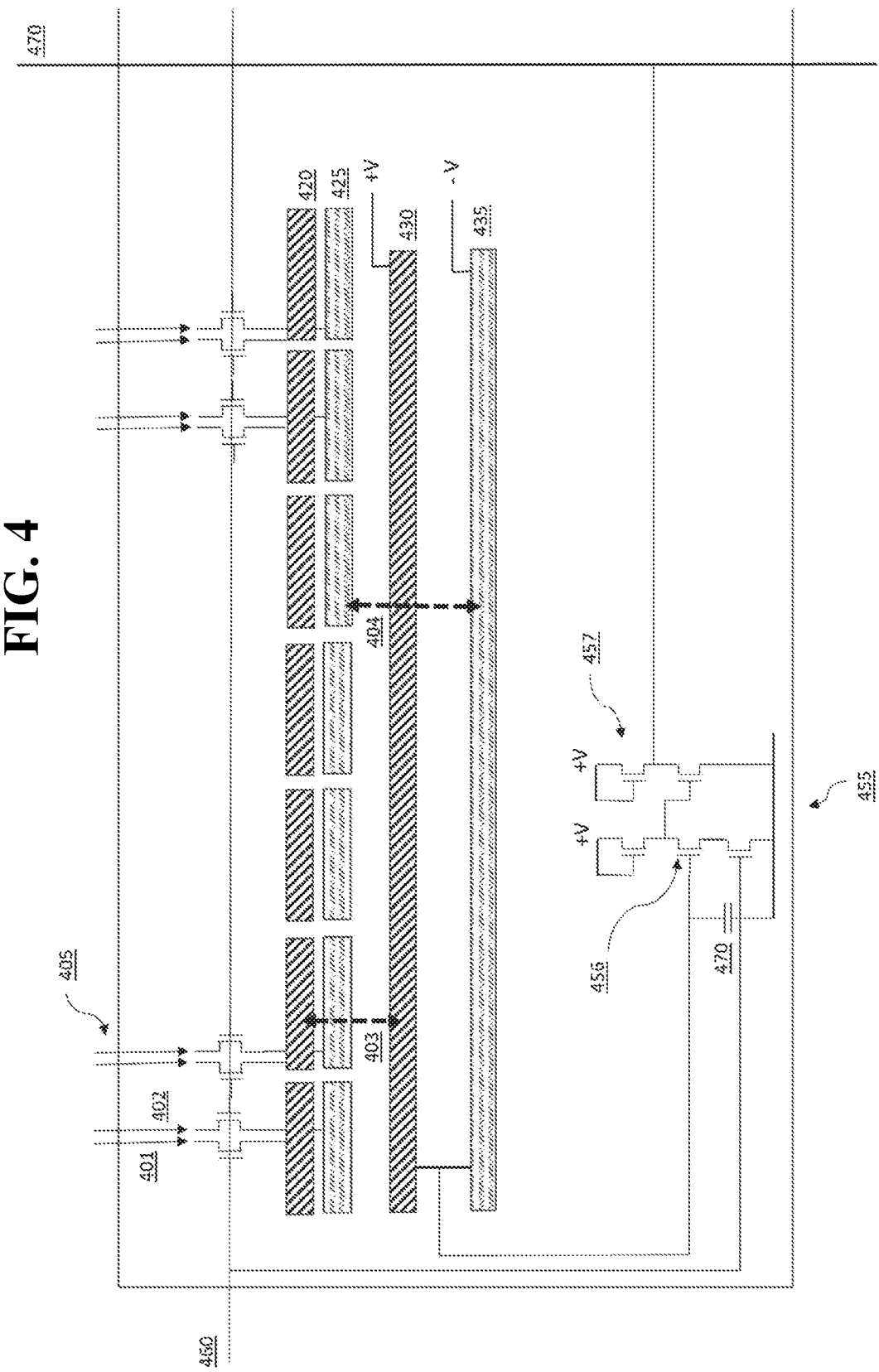
FIG. 4 shows a neuromorphic computing device architecture according to embodiments disclosed herein.

An example layout for a neuron as disclosed herein, which may include multiple excitatory emitters and multiple inhibitory emitters is shown in FIG. 4. Any suitable TFT technology may be used in the array. Because weighting factors may be adjusted on a regular basis such as during learning phases of artificial intelligence computing tasks, the neuron array should self-compensate for TFT threshold voltage shifts, so amorphous silicon, oxide TFTs, organic TFTs, LTPS, or carbon nanotube devices could be considered for the backplane technology. The device may include one or more scan lines 460 and one or more output data lines 470. For example, one output data line may be provided for each neuron column, as disclosed herein. The light-emitting devices 410 such as OLEDs may be configured such that they only activate and emit light when the scan line 460 is being addressed. Such a configuration may be implemented, for example, by connecting the OLEDs 410 to the power rail through a TFT having a gate connected to the scan line that addresses the row of devices 410. Driver chip output or other input signals 405 as disclosed elsewhere herein may be provided to sub-pixel pairs or neuron inputs, such as for pairs of excitatory and inhibitory devices as previously disclosed. For example, excitatory devices 420 and inhibitory devices 425 may receive pairs of inputs 405 that include an excitatory input 401 and an inhibitory input 402, each input going to a corresponding device 420, 425, respectively. As previously described, a neuron as disclosed herein may include a single pair light-emitting devices in place of the multiple devices 420, 425, each of which may receive all of the relevant inputs 405 (excitatory or inhibitory). As previously described, the light emitted by the devices 420, 425 may be received by one or more corresponding excitatory photodetectors 430 and inhibitory photodetectors 435, respectively, which are optically coupled 403, 404 to the respective light-emitting devices. In some configurations, the light-emitting devices and the photodetectors may be segmented so as to avoid resistance losses that may occur in long, thin devices. For example, the photodetector outputs may be coupled to a common conductor that is then connected to the output data lines.

In an embodiment, the summing of weighted inputs may be accomplished by having all the excitatory currents 401 (weighted inputs) as previously disclosed connected to one or a series of light-emitting devices such as individual OLEDs 420, with the light output from these devices captured by one or a series of photodetectors 430 as previously disclosed. The photodetector(s) may be integral with the array, or may be arranged on a different plane, for example on a cover glass or lid. A bus line may be provided in each neuron to collect the output currents from multiple photodetectors. The same approach may be used to sum all the inhibitory inputs. Thus, each neuron in the computing device may sum all the positive and negative weightings for each input: one emitter and photodetector pair for positive weightings and the same for negative weighting. In this arrangement, an output current may be generated that represents the analog sum of all the weighted inputs, both positive and negative. This current may be converted into a voltage through a capacitor 470 as previously disclosed, and the resulting output voltage then may be provided to a threshold device 455 such as the gate of a TFT as part of an inverter chain. If the voltage exceeds a certain value, the inverter will trigger or threshold, and an output voltage will be transmitted to the output data line. In some configurations, another inverter may be used to ensure that an output trigger represents a high voltage instead of a low voltage. Alternatively or in addition, the scan line may be connected to another TFT in the inverter chain to ensure that each neuron can only trigger when it is being addressed. The voltage at the threshold device gate 456 may be reset prior to each scan line being addressed, using a TFT connected to ground and whose gate is activated by the previous scan line (n−1). As another example, the threshold device could also be a dual-gate TFT so the threshold voltage can be electrically adjusted. The threshold device may include a second inverter 457 so that the output trigger is voltage high.

A high-resolution neuron micro-array also may be made on single crystal wafer silicon. In this case all the control, drive and neuron circuitry may be incorporated into the silicon chip. Only monochrome light may be required for processing configurations, so no layer patterning is required at the pixel level during fabrication of the emissive devices. Furthermore, relatively very high resolution circuits may be used. For example, at 5 µm×5 µm for each pair of sub-pixels, a 1,000×1,000 array as previously disclosed may occupy only an area of 5 mm×5 mm. Such an array operating at 1 kHz, may provide computational capacity of $4 \times 10^9$ MACs/$cm^2$/s (multiply and accumulate operations per area per unit time).

Embodiments disclosed herein may use any suitable thin film photodetector technology, organic or inorganic, as long as the photodetector spectral sensitivity as least partially matches the light-emitting device output to the tolerance required to generate the desired output values for the corresponding emitted light intensity. As previously disclosed, photodetectors may be placed on the array lid and aligned with the light-emitting devices, or else integrated on to the emitter array itself and placed under or over the emitters in a different plane. Waveguides also may be used to couple light from the emitters to one or more photodetectors if they are both placed in a similar plane.

A system architecture of a computing device as disclosed herein and as shown in FIG. 4 may include several components: the array itself and the electronics/drive/control circuitry external to the actual array, either integrated onto the array substrate or external to this substrate.

This array itself may include a series of scan and data lines. The scan lines may be driven by a shift register that is either integral with the panel or external. The data line pairs that provide each neuron input may be driven by conventional analog data drivers, such as those used in an OLED display panel or the like. Each neuron also may have an output data line as previously disclosed, which can be common to each column of neurons in the array. As previously disclosed, the output data lines may be connected to a threshold device and/or a sensor chip or similar component to detect their voltage and hence the output state of each neuron as the array is multiplexed in sequence using the shift register and scan lines.

For configurations in which a lower degree of fan-in is acceptable, Broadcast Loops (BLs) may be used as previously indicated. Each neuron on a scan line may be incorporated into a BL, but there may be less than 1 BL for each neuron on a scan line. For several neurons per scan line (e.g., 10 per line), then each column of neurons may become a Broadcast Loop in which neurons near the data driver act as edge or interface neurons and may be connected to similar neurons in the next or previous Loop. Neurons or pixels near the data line edge (driver chip) may be edge or interface neurons that connect to two different broadcast loops.

If more than one neuron is implemented per scan line, then it may be relatively difficult for the array to provide true "broadcast to all" functionality. For example, in an arrangement having 10 neurons per scan line in a 1,000,000 pixel array (100 pixels per neuron), there are 10,000 neurons with 10 BLs and 1,000 neurons in each BL. Each neuron would then have 100 input pairs (positive/negative) and would be part of a BL with 999 other neurons. Thus, it may be necessary to select which neurons connect to any given neuron.

Different patterns or methodologies may be used. For example, a relatively small number (e.g., 50) neighboring neurons in each direction may be selected as the (100) input pairs. As another example, a sampling approach could be applied to connect 10 nearest neurons, every second neuron for the next 20, every third for the next 30, every fourth for next 40 and every fifth for next 50, in each direction, to provide the desired number of inputs (e.g., 100 continuing the prior example). This protocol may be stored, for example, in the system controller. In this case each neuron may have connections out to +/−150 neurons each side of itself, while only having 100 total connections. Interface neurons or edge neurons may connect to a number of neuron outputs from neighboring BLs, with a corresponding reduction in the number of interconnects to their own BL.

Figure 5:
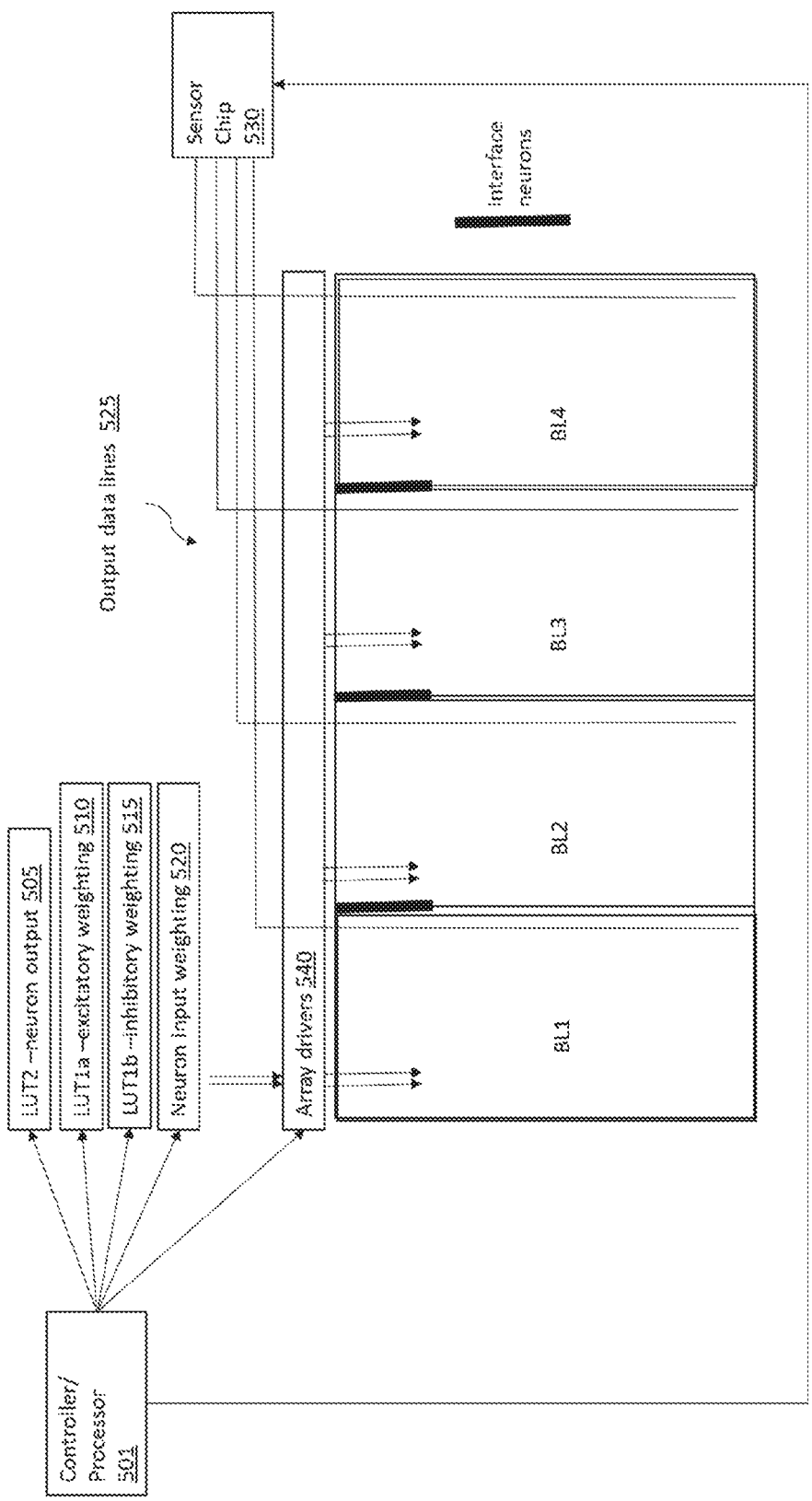
FIG. 5 shows a neuromorphic computing device architecture according to embodiments disclosed herein.

An example schematic view of an architecture including four Broadcast Loops is shown in FIG. 5. As with other embodiments disclosed herein, various lookup tables or other structures may be used to store various data. For example, lookup tables 505, 510, 515, 520 may store the output of each neuron, excitatory weighting values for each neuron, inhibitory weighting values for each neuron, and/or the neuron input weighting values, i.e., the voltage(s) associated with the required current(s), respectively. One or more array drivers 540 may provide the input values as electrical signals to the Broadcast Loops and/or interface neurons as previously disclosed. Output data lines 525 from each broadcast loop may be read by a sensor chip 530 or other device. A controller or other processor 501 may control operation of and access to the lookup tables 505-520, operation of the sensor chip 530, and operation of the array driver(s) 540.

As previously disclosed, a sensor chip or other device may be used to sense the output (high or low) of each neuron output data line, as multiplexed by the scan lines. Look up tables or similar structures may be be used to store the output status of each neuron in the array, the positive weighting factor for each neuron input, and/or the negative weighting factor for each neuron input. A controller may calculate the weighting factors for each neuron input in real time based on the product of the previous neuron output (1 or 0) and the neuron input weighting factor, such as the weighting factors 320 shown in FIG. 3. This calculation is equivalent to the input video signal in a conventional display, and the resulting output may be provided to the array data drivers to produce an output voltage associated with the analog current in each photodetector that corresponds to the input weighting factor based on the light measured from the light-emitting device.

As previously described, panel and imaging architectures may be particularly suited to implement the hybrid optical/electrical computing devices disclosed herein. Accordingly, embodiments disclosed herein may provide for multi-function devices that can serve alternatively or simultaneously as a display panel, an imaging sensor, and a computing device. For example, a single array of neurons as disclosed herein may serve as both a two-dimensional imaging device and as an artificial intelligence or other computer processor. As another example, embodiments disclosed herein may provide concurrent imaging, processing, and display capabilities, such as for augmented reality (AR) uses. In such an application, a single device may obtain image data, for example by using the photodetectors to obtain RGB or monochrome image data from the environment. The device then may switch modes or use other pixels formed into neurons in the device to process the image data for AR purposes. Finally, the device may switch modes again and/or use other pixels in the device to provide a modified display of the image data, such as to insert, remove, or modify components of the environment captured during the imaging process. The device may be implemented as any suitable display architecture, such as an active matrix OLED (AMO-LED) or similar device. When a device as disclosed herein is configured to be a multi-purpose device, various portions of the device may be reserved for use in specific functions. For example, a portion of a display active area may be reserved for use only as artificial neurons, only for use as a display, or only for use as an imaging device. One technique to do so is to have lines or regions of pixels that are constructed or used only to serve a single purpose, such as alternating lines of neurons, imaging pixels, and display pixels. Alternatively, portions of the device active area (i.e., the area used for imaging, display, and/or processing) may be reserved for a specific use at a set period of time. Alternatively or in addition, each pixel area may have a portion reserved for use as an imaging pixel, a display pixel, or a neuron.

Various architectures and techniques may be used to achieve a multi-function device in a single array of neurons as previously disclosed. For example, a separate photodetector and series-select TFT may be placed in each pixel of the array, using the same processes used to fabricate the neuromorphic computing array. Additional data lines may be added to each column of pixels to allow the imaging array photodetector currents to be recorded by a sensing chip external to the array, either placed on the same substrate or external to the imaging substrate and accessed through external electrical connections.

In some embodiments, the functionality of the array between imaging, display, and/or processing may be alternated using alternate frame times. For example, the device may scan through the entire array as an imaging device by accessing output signals from each photodetector without operating the light-emitting devices within each neuron, and then repeat the process with the array as a processor as previously disclosed. As another example, a second set of scan lines may be used such that the array can be simultaneously multiplexed as both an imager and a processor. In this arrangement, scan driver for each function may be placed on either side of the array. Each pixel then both acts as an imaging circuit (TFT in series with a photodetector) and as part of a neuromorphic computing array as previously disclosed herein.

Figure 6:
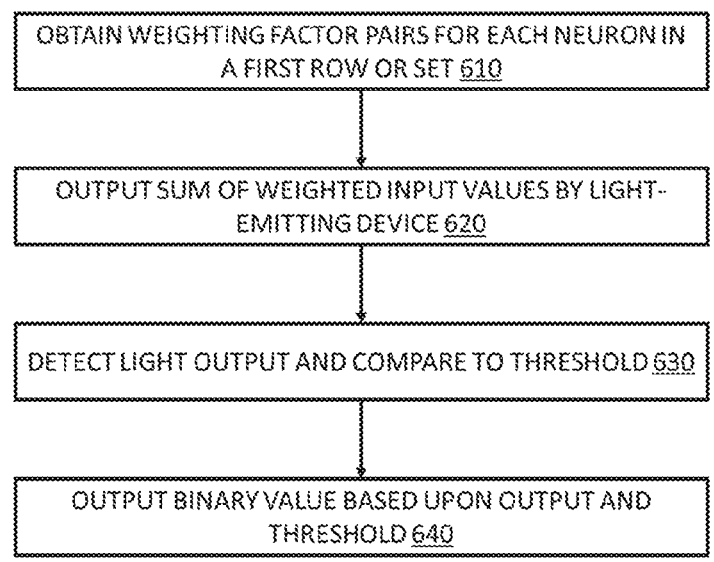
FIG. 6 shows an example process for operating a hybrid neuromorphic computer according to embodiments disclosed herein.

A computing device as disclosed herein generally may be operated in any manner appropriate for a neuromorphic computing device or neural network, while using the optical components disclosed herein. An example process of operating a device as disclosed herein is shown in FIG. 6. At 610, weighting factors and initial inputs may be obtained for a first row or other group of neurons. The neurons may output a weighted sum of the inputs at 620, based upon the weighting factors by emitting light from a light-emitting device within the neuron as previously disclosed. At 630 one or more photodetectors may be used to detect the intensity of light emitted by the light-emitting device or devices within each neuron and, at 640, the detected light may be used to generate an output value. For example, a signal from a photodetector may be compared to a threshold level to produce an output of 1 or 0 depending upon whether the light is above the threshold or not.

More specifically, a computation process according to embodiments disclosed herein may iterate through each row n of neurons within an array as previously described. Driver chips within the array may provide weighting factor pairs for each input node. The data driver output may be synchronized to each row, such as via a scan driver shift register or other construct. The driver chip output for each neuron in the row may be calculated as a first stored lookup table value (LUT1), multiplied by a logical value indicating whether a previous neuron provided an output or not. This logical value also may be stored in a lookup table LUT2 as previously disclosed. A light-emitting device such as an OLED then may provide a light input equal to the sum of all weighted inputs received by the neuron. A threshold device such as a comparison circuit then may provide a logical output value of 0 or 1 to the output line of the neuron. The output data lines may be read by a sensor chip as previously disclosed, with the logical values stored in LUT2.

In an embodiment, one or more pairs of lookup tables may be used to store weighting factors for each neuron. For example, positive and negative values may be stored for each neuron in lookup tables for that neuron. The weight factors for each neuron may be stored in a common lookup table across the device, or each neuron may have an individual lookup table. After the output data line is read by an external sensor, it may be reset before the scan driver moves to the next n+1 scan line in the array. The weighting factors may be adjusted by a system controller in accordance with neural network learning techniques known in the art. In other embodiments these weighting factors can be stored in circuitry in each pixel as previously disclosed.

Compared to prior approaches to artificial neuron arrays, embodiments disclosed herein may not require advanced optics, filters and/or lasers to be developed and integrated onto expensive substrates. Embodiments disclosed herein also may use established manufacturing processes and available components. Accordingly, embodiments disclosed herein may provide significant improvement in manufacturability, use, and cost over conventional techniques.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

I claim:

1. A processing device comprising:
a plurality of communicatively-coupled thin film artificial neurons, each artificial neuron comprising:
one or more thin film light-generating components; and
a photodetector configured to sum outputs of the one or more light generating components to an output of the photodetector;
wherein each output of each of the one or more thin film light-generating components is determined by one or more inputs to the each light-generating component.

2. The processing device of claim 1, wherein, for a first plurality of the plurality of artificial neurons, the photodetector output of each neuron of the first plurality of neurons is provided as one of the one or more inputs of at least one other neuron of the first plurality of neurons.

3. The processing device of claim 2, wherein weighting factors are applied to the inputs of the one or more light-generating components.

4. The processing device of claim 3, wherein the weighting factors are obtained from a source external to the plurality of neurons.

5. The processing device of claim 3, wherein the weighting factors are obtained from a source stored in memory within each of the plurality of neurons.

6. The processing device of claim 1, wherein an output of the photodetector is provided to a threshold device that provides an output based upon the output of the photodetector, and the output of the threshold device is provided as an input to one or more of the plurality of neurons.

7. The processing device of claim 1, wherein each artificial neuron comprises a plurality of photodetectors.

8. The processing device of claim 1, wherein the output of the photodetector is provided to a threshold device, the output of which is greater than zero only if the sum of the outputs of photodetectors providing outputs to the threshold device exceeds a threshold value.

9. The processing device of claim 8, wherein, if the sum of the outputs of the photodetectors exceeds a threshold value, the output of the threshold device is in the form of a spike.

10. The processing device of claim 1 where the input signals are in the form of a spike.

11. The processing device of claim 1, wherein the processing device is also a display panel.

12. The processing device of claim 1, wherein each of the one or more light-generating components comprises an organic light emitting diode (OLED).

13. The processing device of claim 1, wherein the photodetector comprises a thin film photodetector disposed within the device such that light emitted by the light-generating component is incident on the thin film photodetector.

14. The processing device of claim 1, wherein each of the plurality of artificial neurons is electrically or optically connected to each other of the plurality of artificial neurons such that an output of each threshold device from each neuron is available as an input to one or more other artificial neurons of the plurality of neurons.

15. The processing device of claim 12, wherein the OLED in each artificial neuron of the plurality of artificial neurons is driven by a plurality of row and column lines.

16. The processing device of claim 1, wherein the device is operable as an imaging device.

17. The processing device of claim 16, wherein the device comprises a plurality of pixels and each of the plurality of artificial neurons comprises one or more of the plurality of pixels.

18. The processing device of claim 16, wherein the device is further operable as a display panel.

19. The processing device of claim 18, wherein a portion of an active area of the display panel is reserved for use as artificial neurons or imaging pixels.

20. The processing device of claim 1, wherein each artificial neuron comprises a plurality of light generating components.

21. The processing device of claim 1, wherein each artificial neuron of the plurality of artificial neurons is electrically connected to at least one other artificial neuron of the plurality of artificial neurons.

22. The processing device of claim 1, wherein each artificial neuron of the plurality of artificial neurons is optically connected to at least one other artificial neuron of the plurality of artificial neurons.

23. A method of operating an artificial neuron array comprising an array of neurons arranged in a plurality of rows and a plurality of columns, the method comprising:
selecting a first row of the plurality of rows of neurons;
receiving weighting factor pairs for each neuron in the first row;
outputting, by each artificial neuron in the first row, a sum of weighted input values, the weighted input values being represented by light emitted by a light-emitting device of the each artificial neuron based upon the weighting factor pairs for the each artificial neuron and one or more input values received by the each artificial neuron;
detecting, by a photodiode in each neuron, the light emitted by the light-emitting device in the each neuron; and
for each neuron, based upon the detected light emitted by the light-emitting device in the each neuron and a threshold value, outputting a value of 0 or 1.

* * * * *